(12) United States Patent
Middelman et al.

(10) Patent No.: US 6,613,598 B1
(45) Date of Patent: Sep. 2, 2003

(54) METHOD FOR MAKING A PHOTOVOLTAIC CELL CONTAINING A DYE

(75) Inventors: Erik Middelman, Arnhem (NL); Rudolf Emmanuel Isidore Schropp, Arnhem (NL); Joshua Samuel Salafsky, Arnhem (NL)

(73) Assignee: Akzo Nobel N.V., Arnhem (NL)

( * ) Notice: Subject to any disclaimer, the term of this patent is extended or adjusted under 35 U.S.C. 154(b) by 0 days.

(21) Appl. No.: 09/646,843

(22) PCT Filed: Mar. 19, 1999

(86) PCT No.: PCT/EP99/01898

§ 371 (c)(1),
(2), (4) Date: Jan. 29, 2001

(87) PCT Pub. No.: WO99/49483

PCT Pub. Date: Sep. 30, 1999

(30) Foreign Application Priority Data

Mar. 26, 1998 (EP) .............................................. 98200940

(51) Int. Cl.$^7$ .............................................. H01L 21/00
(52) U.S. Cl. .............................. 438/30; 438/33; 438/26; 438/22
(58) Field of Search .............................. 438/48, 56, 57, 438/58, 30, 31, 32, 63, 64, 65, 22–29, 33–47

(56) References Cited

U.S. PATENT DOCUMENTS

| | | | | |
|---|---|---|---|---|
| 5,350,644 | A | * 9/1994 | Graetzel et al. | 429/111 |
| 5,441,827 | A | * 8/1995 | Gratzel et al. | 429/111 |
| 5,525,440 | A | * 6/1996 | Kay et al. | 429/111 |
| 5,582,653 | A | * 12/1996 | Kataoka et al. | 136/251 |
| 5,674,325 | A | * 10/1997 | Albright et al. | 136/250 |
| 5,735,966 | A | * 4/1998 | Luch | 136/244 |
| 5,830,597 | A | 11/1998 | Hoffmann et al. | 429/111 |
| 6,130,379 | A | * 10/2000 | Shiotsuka et al. | 136/251 |
| 6,184,057 | B1 | * 2/2001 | Van Andel et al. | 438/66 |
| 6,191,353 | B1 | * 2/2001 | Shiotsuka et al. | 136/256 |

FOREIGN PATENT DOCUMENTS

| | | | |
|---|---|---|---|
| EP | 0 739 020 | 10/1996 | H01G/9/20 |
| JP | 89-119072 | 5/1989 | |
| WO | WO 91/16719 | 10/1991 | H01G/9/20 |
| WO | WO 97/15959 | 5/1997 | H01M/14/00 |

OTHER PUBLICATIONS

*International Search Report*, dated May 5, 1999.

Andreas Kay, Michael Gratzel, *Low cost photovoltaic modules based on dye sensitized nanocrystalline titanium dioxide and carbon powder*, Solar Energy Materials and Solar Cells, 44 (1996) 99–117.

M. N. Nazeeruddin, A, Kay, I. Rodicio, R. Humphry–Baker, E. Muller, P. Liska, N. Vlachopoulos, and M. Gratzel, *Conversion of Light to Electricity by cis–$X_2$Bis(2,2'–bipyridyl–4,4'–dicarboxylate)ruthenium(II) Charge–Transfer Sensitizers ($X=Cl^-, Br^-, CN^-, SCN^-$) on Nanocrystalline $TiO_2$ Electrodes*, Journal American Chemical Society Journal American Chemical Society, 1993, 115, 6382–6390.

Y. Kishi, H. Inoue, K. Murata, H. Tanaka, S, Kouzuma, M. Morizane, Y. Fukuda, H. Nishiwaki, K. Nakano, A. Takeoka, M. Ohnishi and Y. Kuwano, *Ultraligh flexible amorphous silicon solar cell and its application to an airplane*, Solar Energy Materials 23, 1991, 312–318.

\* cited by examiner

Primary Examiner—Matthew Smith
Assistant Examiner—Renzo N. Rocchegiani
(74) Attorney, Agent, or Firm—Richard P. Fennelly

(57) ABSTRACT

The invention pertains to a method of making a photovoltaic cell at least comprising the following layers in the following order:

- a first electrode layer,
- a transparent wide band gap semiconductor layer provided with a layer of a photosensitising dye or pigment which in combination with the semiconductor layer has the ability to spatially separate photogenerated electrons from their positive countercharges,
- a layer of an electrolyte,
- a catalyst layer, and
- a second electrode layer.

The method is characterized in that the first electrode layer and the semiconductor layer and/or the second electrode layer and the catalyst layer are deposited on a flexible temporary substrate that is removed later on. The electrode or electrodes, which are deposited on the temporary substrate, are transparent. The invention allows the roll-to-roll manufacture of said photovoltaic cell while providing great freedom in selecting the processing conditions.

12 Claims, No Drawings

METHOD FOR MAKING A PHOTOVOLTAIC CELL CONTAINING A DYE

This application claims priority of European Patent Application No. 98200940.9, filed on Mar. 26, 1998.

BACKGROUND OF THE INVENTION

1. Field of the Invention

The invention pertains to a method of making a photovoltaic (PV) cell at least comprising the following layers: a first electrode layer, a transparent wide band gap (and preferably high surface area) semiconductor layer provided with a (mono)layer of a photosensitising dye or pigment which in combination with the semiconductor layer has the ability to spatially separate photogenerated electrons from their positive countercharges, an electrolyte layer, a catalyst layer, and a second electrode layer, wherein at least one electrode layer is transparent. Given that, e.g., sunlight can thus be used to generate power, such photovoltaic cells form an interesting alternative source of energy, one much cleaner than fossil fuels or nuclear power.

2. Description of the Related Art

Methods for making the photovoltaic cells at hand are known in the art, for example from WO 91/16719. This international patent application describes (see, e.g., Example 34 in conjunction with FIG. 1) a photovoltaic cell comprising a light transmitting electrically conductive layer (commonly referred to as Transparent Conductive Oxide or TCO) as electrode layer deposited on a glass plate or transparent polymer sheet. On top of the TCO are deposited several $TiO_2$ layers which are dye-loaded. The last $TiO_2$ layer is covered with an electrolyte, a catalyst layer, and a counter- or back-electrode which can also be a TCO.

In order for at least one of the TCOs to have the desired properties (especially transparency) and texture, it should preferably be formed at a temperature of at least 400° C. Further, the semiconductor layer, which usually essentially consists of titanium dioxide, is preferably sintered at similar temperatures and in many embodiments, the catalyst layer is subjected to temperatures exceeding 350° C. Because of that, the transparent substrates which are suitable for applying these layers onto in forming photovoltaic cells of this type is restricted to, int. al., glass substrates or transparent polymer sheets having a high temperature resistance. These materials are either rigid or quite expensive.

For the PV cells at hand to become a serious and economically attractive alternative, they need to be provided in a suitable form (less rigid and bulky) and made by relatively low-cost processes, using relatively inexpensive raw materials. Hence, a process is required which allows the roll-to-roll manufacture of a photovoltaic cell as described in the first paragraph, while at the same time any desired transparent conductor material, deposition process, and sintering process can be used and without the use of expensive or rigid materials as transparent substrate being necessary. These requirements, and other desirable objectives, are met by the process of the invention.

BRIEF SUMMARY OF THE INVENTION

The invention is directed to a method of making an organic photovoltaic cell wherein the first electrode layer and the semiconductor layer are deposited on a flexible temporary substrate that is removed later on and/or the second electrode layer and the catalyst layer are deposited on a flexible temporary substrate that is removed later on, wherein the electrode or electrodes that are deposited over a temporary substrate are transparent.

DETAILED DESCRIPTION OF THE INVENTION

These steps and their sequence essentially make it possible for the PV cells at hand to be produced roll-to-roll and in the form of a flexible foil, while for most embodiments at least part of the desired order of manufacture that is customary in the case of similar PV cells produced on glass substrates is still maintained. When following the process of the invention, the temporary substrate can be selected so as to allow any further process steps (like the high-temperature application of the first or second transparent conductor layer, the sintering of the semiconductor layer, and the formation of the catalyst layer) without any concerns about its (i.e. the substrate's) transparency or other properties needed (flexibility, durability, etc.) for the functioning of the eventual PV foil.

It is noted that Japanese Laid-open 1980-143706 describes the forming of a transparent electrically conductive (TCO) layer on the surface of a substrate, forming a polymer product (e.g., a film or a lens) on the conductive layer, and removing the substrate. Thus, the TCO layer and its method of deposition (in terms of temperature and duration) can be selected freely. This reference concerns a technical field differing from the one at hand (formed polymeric products instead of organic photovoltaic cells) and teaches that a transparent polymer should be applied to the TCO prior to instead of after the removal of the temporary substrate. Thus, the artisan would not combine this publication with WO91/16719 and, even if he were to do so, it would not result in the process according to the present idea.

Kishi et al., "Ultralight Flexible Amorphous Silicon Solar Cell and Its Application for an Airplane," *Technical Digest of the International PVSEC-5*, Kyoto, Japan, 1990, pages 645–648, discloses a solar cell manufactured by depositing the respective layers on a transparent plastic film. A temporary substrate is neither mentioned nor implied. WO 97/15959 describes an electrochemical cell comprising a working electrode and a counter-electrode provided on flexible polymeric substrates. The working electrode comprises a semiconductor film which is deposited in the form of a paste, and then dried and sintered at a temperature below 200° C. The use of temporary substrates is not disclosed.

JP laid-open patent application 89-119072 describes a process for producing a PV cell comprising the steps of forming a heat resistant, flexible and electrically insulating transparent plastic layer on the surface of a temporary substrate, and sequentially depositing thereon a TCO, a semiconductor layer, a rear electrode, and a carrier. Then, the temporary substrate is removed. This process differs from the process of the invention in that in the process of the invention the TCO is coated onto the temporary substrate instead of onto a transparent plastic layer. This has the advantage that in the process according to the invention the transparent layer that is, optionally, applied to the TCO after removal of the temporary substrate does not have to be resistant to the conditions prevailing during the application of the TCO and the further layers.

The temporary substrate on the side of the first electrode layer is removed after the first electrode layer and the semiconductor have been applied. It is preferred that at least the dye and the electrolyte are also applied before the temporary substrate is removed.

Additional mechanical strength can be provided by laminating all the essential layers together before removal of the substrate or substrates. This is preferably done by spotbonding two separately prepared components (one at least comprising the first electrode layer, the semiconductor layer, and the dye, the other at least comprising the second electrode layer and the catalyst layer) together at the interface of the catalyst layer and the semiconductor layer. In that case, the electrolyte fills the space between the semiconductor layer and the catalyst layer.

It is further preferred to apply a carrier layer before removing the (last) temporary substrate, this in order to have the thin PV foil supported during as many process steps as possible and to ensure that the foil exhibits sufficient strength and bending stiffness (preferably adapted to the intended end product). After removal of the (last) temporary substrate, the exposed electrode is preferably provided with a carrier layer or a transparent layer, which further adds to the mechanical and barrier properties of the PV foil and/or the end product. Of course it is not the intention to provide both electrodes with a carrier layer. At least one of the electrodes should be either provided with a transparent layer or remain uncovered. The provision of a transparent layer is preferred to increase the durability of the product.

In order to allow efficient sealing, the carrier layer or transparent layer on the side of the first electrode layer and the carrier layer or transparent layer on the side of the second electrode layer extend beyond the inner layers of the cell on at least two opposing sides. Thus, the cell can be easily sealed by welding or by glueing the said extending edges together, ensuring of course that the electrodes are not short-circuited, and one of the most persistent problems encountered in dye-loaded PV cells is solved.

It was found that it is advantageous to coat the semiconductor layer onto the (first) transparent electrically conductive layer before the latter has been substantially cooled, (i.e., is still warm), because this will enhance contact between the layers and will result in less pollution and more favourable mechanical and electro-optical properties.

Both the temporary substrate itself and the method to remove it (suitably by means of dissolving or etching) can be selected without great difficulty by the man skilled in the art. Thus, the temporary substrate may be a "positive" photoresist, i.e., a photosensitive material which upon irradiation undergoes a change from solvent-resistant to solvent-extractable, e.g., cross-linked polyimides. In order to meet the object of using low cost materials, these are not the substrates of preferred choice. In this respect it is more advantageous to use polymers that can be removed by means of plasma etching (e.g., $O_2$ plasma or, e.g. for polysiloxane polymers, $SF_6$ plasma). While basically any polymer will thus be suitable, in view of the above it is, of course, referred to employ polymers which can withstand higher temperatures (250° C. and ore preferably above 400° C.).

By preference, the temporary substrate according to the present invention is a metal or metal alloy foil. The main reason for this is that such foils generally are able to withstand the highest temperatures during further processing, release virtually no volatile components, and can be removed relatively easily using known etching techniques. Another reason to choose metal, notably aluminium or copper, is that the PV foil should eventually contain "side" electrodes (which form a contact for connection to any auxiliary apparatus or net, i.e., to actually use the PV foil as a source of power). By allowing part of the temporary substrate to remain in place (e.g., as side edges or stripes) these contacts do not need to be applied separately.

Suitable metals include steel, aluminium, copper, iron, nickel, silver, zinc, molybdenum, chromium, vanadium, magnesium, and alloys or multilayers thereof. Int. al. for economic reasons it is preferred to employ Fe, Al, Cu, or alloys thereof. For the sake of performance (combined with costs) aluminium, electrodeposited iron, and electrodeposited copper enjoy the highest preference. Suitable etching techniques are known and, while different for each metal chosen, can be selected by the person skilled in the art using due skill. Preferred etchants include acids (Lewis acids as well as Bronstedt acids), e.g., in the case of copper as a metal foil it is preferred to use $FeCl_3$, nitric acid, or sulfuric acid. Aluminium can be efficiently removed by means of, e.g., caustic soda (NaOH).

For the sake of removability, the temporary substrate preferably is as thin as possible. Of course, it should still allow applying further layers onto it, and keeping these together, but this generally will not require thicknesses above 500 µm. Preferably, the thickness is 1 to 200 µm. Depending on the modulus of elasticity, a majority of materials will require a minimum thickness of 5 µm, in which case the preferred range is 5 to 150 µm, preferably 25 to 100 µm, thickness.

The temporary substrate can also be a electrodeposited (i.e., galvanic) metal layer. It is desired to choose copper for the electrodeposited metal foil. However, as copper may have the tendency to diffuse through the PV layers, it is preferred to provide the copper foil (galvanically) with a non-reducing diffusion barrier, e.g., an anti-corrosion layer, notably zinc oxide, or to select a transparant conductor which has the ability to prevent said diffusion, e.g., $TiO_2$, $Al_2O_3$, $SnO_2$, or ZnO. The anti-diffusion layers can be applied, e.g., galvanically by Physical Vapour Deposition (PVD) or by Chemical Vapour Deposition (CVD).

Instead of the copper foil being provided with an anti-diffusion layer, which, as a rule, will be removed with the temporary substrate, it is also possible to provide the copper foil (or any other temporary substrate chosen) with a layer of a suitable kind of glass. This glass layer essentially is transparent, and can thus be permanent, serving as a protective window for the transparent conductor layer. For reasons of economy, and to allow roll-to-roll processing, the glass layer preferably is very thin, e.g. 10–1000 nm, preferably 100 to 200 nm thickness. A suitable application method for such a layer, e.g., is PECVD (Plasma Enhanced Chemical Vapour Deposition) of $SiH_4$ and $N_2O$ (plasma oxide) and adding a suitable additive such as $B_2H_6$ to form a boron-silicate glass having a favourable transparency. It is preferred to apply APCVD silicon oxide.

The TCO or TCOs can be deposited in a known manner, e.g., using Metal Organic Chemical Vapour Deposition (MOCVD), sputtering, Atmospheric Pressure Chemical Vapour Deposition (APCVD), PECVD, spray pyrolysis, evaporation (physical vapour deposition), electrodeposition, screen printing, sol-gel processing, etc. It is preferred that the transparent conductor layer is applied at a temperature higher than 180° C., preferably higher than 400° C. or even 500° C., so as to make it possible to obtain a transparent conductor layer having advantageous properties and/or texture.

Examples of materials suitable for use as the transparent conductor layer are indium tin oxide, zinc oxide, fluorine-, aluminium- or boron-doped zinc oxide, cadmium sulfide, cadmium stannate, cadmium oxide, tin oxide and, most preferably, antimone- or, in particular, fluorine-doped tin oxide. This last transparent electrode material is preferred for its ability to form a desired crystalline surface having a columnar, light-scattering texture if applied at a temperature well above 400° C., preferably 500° C. to 600° C. Particularly with this electrode material, the advantages of selecting a temporary substrate (which allows said high temperature) and, more particularly, selecting a textured electrodeposited metal substrate, are exhibited to a great extent. Further, the material has the advantage of being resistant to the most preferred etchants used, as well as having better chemical resistance and better opto-electronic properties than indium tin oxide. Besides, it is much less expensive.

As mentioned above, the semiconductor, e.g., titanium dioxide, is applied and sintered before or after deposition of the (first) TCO. In particular, the processes of dip-coating, screen printing, and painting for applying the nanocrystalline film can be performed in a continuous (roll-to-roll) fashion. If the semiconductor is deposited directly onto the transparent electrically conductive layer by means of spray pyrolysis or CVD, fewer process steps are needed, contact with the TCO is improved, and the porosity of the layer is excellent.

In the case of titanium dioxide, droplets of $TiCl_3$ and $H_2O$ are sprayed onto a pre-heated surface (i.e, the temporary substrate or the TCO). The $TiCl_3$ droplets vaporise when they approach the hot surface. At the surface, a chemical vapour reaction takes place, resulting in a porous layer of titanium oxide on the said surface and gaseous hydrochloric acid.

The photosensitising dye is applied by, e.g., dipping in a solution, die coating, vacuum evaporation, Langmuir Blodgett coating, etc. Suitable dyes are disclosed, int. al., in WO 91/16719. Especially preferred are dyes containing ruthenium. Further, the dye is preferably selected such that its lowest unoccupied molecular orbital (or LUMO) is higher than the conduction band edge of the semiconductor.

The electrolyte is applied, e.g., by means of immersion, brushing, casting, etc. Again, suitable electrolytes are disclosed, int. al., in WO 91/16719. Especially preferred electrolytes are mixtures of ethylene carbonate and propylene carbonate containing an iodine/iodide redox couple and molten salt containing an iodine/iodide redox couple. Polymeric and ceramic electrolytes are also very suitable.

The catalyst layer preferably comprises platinum or carbon particles, but other catalysts are by no means excluded. It should be noted that in many embodiments the catalyst layer will not consist of a continuous film but, instead, of a multitude of discrete particles.

Non-transparent electrode layers may be made up of any suitable material, preferably aluminium, silver, or a combination of layers of both. These metal layers can be applied (preferably at a relatively low temperature, e.g., lower than 250° C.) by means of (in vacuo) physical vapour deposition (evaporation) or sputtering, optionally using a mask to prevent deposition at sites where stripes need to be etched or by use of masking wires. In the case of silver, it is preferred to first apply an adhesion promotion layer, for which, e.g., $TiO_2$ and ZnO are suitable materials which have the advantage of additionally being reflecting if applied in a suitable thickness (e.g. about 80 nm).

The above-mentioned carrier need not be transparent and will eventually form a true substrate (the layer denoted "temporary substrate" during the process in fact is a "superstrate," as it is placed on the eventual front side or top of the foil). Suitable materials for this carrier layer include polymeric foils, such as polyethylene terephthalate, poly (ethylene 2,6-naphthalene dicarboxylate), polyvinyl chloride, or high-performance polymer foils such as aramid or polyimide foils, but also, e.g., metal foils provided with an insulating (dielectric) top layer, plate glass, or composites comprising epoxy and glass. Preferred are polymeric "co-extruded" foils comprising a thermoplastic adhesive layer having a softening point below that of the carrier itself. Optionally, the co-extruded foil is provided with an anti-diffusion layer (for instance, polyester (PET), copolyester, or aluminium). The thickness of the carrier should preferably lie within the range of 50 $\mu$m to 10 mm. More preferred ranges are 75 $\mu$m to 6 mm, 100 $\mu$m to 1 mm, and 150 $\mu$m to 300 $\mu$m. The bending stiffness (defined within the framework of the present invention as the modulus of elasticity ("E" in $N/mm^2$) of the material multiplied by the thickness ("t" in mm) of the carrier cubed: $E \times t^3$) preferably is larger than $16 \times 10^2$ Nmm and will usually be smaller than $15 \times 10^6$ Nmm.

The carrier (the eventual substrate) itself may already be, or contain, a structure required for the intended use. Thus, the carrier may be, e.g., a tile or set of tiles, roof tiles, shingles, a car roof, a caravan roof, etc. However, in general it is preferred that the temporary substrate and/or the carrier is flexible.

The above-mentioned transparent layer generally is a polymeric film having a high transmission, such as amorphous (per)fluorinated polymers, polycarbonate, poly (methyl methacrylate), or any available clear coat such as those used in the automotive industry. The thickness of the transparent foil should preferably be at least 25 $\mu$m, preferably at least 50 $\mu$m. If so desired, an additional anti-reflection, antidiffusion, or anti-pollution layer may be applied.

It is further preferred that after the last process step the bending stiffness of the foil (which bending stiffness will usually be determined for the greater part by the carrier and the top coat) is greater than the bending stiffness of any one of the intermediate products.

The PV cells according to the present invention can very easily be connected in series using external means (i.e., means not incorporated within the sealed volume). However, the skilled person will have no difficulty in providing separate serially connected sub-units within the said sealed volume.

The term "transparent" is defined as exhibiting a transmittance of at least 40% and preferably at least 60% of the incident light that can be converted into an electrical current by the PV cell.

It should be noted that TCOs are also wide band gap semiconductors. However, within the framework of the present invention the term "transparent wide band gap semiconductor" is used to denote the layer that is dye-loaded.

The invention will now be illustrated by means of unlimitative examples.

EXAMPLES

In the examples below, a nanocrystalline film of $TiO_2$ was made by painting a colloid on a flexible aluminium substrate provided with a $SnO_2$ film (i.e., the first electrode). The colloid was prepared in accordance with M. K. Nazeeruddin et al., "Conversion of Light to Electricity by cis-$X_2$Bis(2, 2'-bipyridyl-4,4'-dicarboxylate)ruthenium(II) Charge-Transfer Sensotizers (X=Cl[-], Br[-], I[-], CN[-], and SCN[-]) on Nanocrystalline $TiO_2$ Electrodes", *J. Am. Chem. Soc.* 1993, Vol. no. 115, pp. 6382–6390. The substrate and the film were then fired for 15 minutes in an air oven at 450° C. After firing, the film and the substrate were immersed in a solution of a dye, i.e. 0,5 mM Ru(II)-cis-di(isothiocyanato)bis(2,2'-bipyridyl-4,4'-dicarbosylate)in acetonitrile, again as described in M. Nazeeruddin et al. This resulted in approximately one monolayer of surface-adsorbed dye on the nanocrystalline film.

Example 1

The obtained Al/SnO$_2$/nanocrystalline TiO$_2$-dye film was covered by an Al/ITO counter (or second) electrode. The Al/ITO electrode had previously been treated with a small amount of hexachloroplatinic acid (0,1 mM in isopropanol) covering it with Pt grains (i.e., the catalyst) and was annealed at 380° C. for 15 minutes.

A liquid electrolyte consisting of a 50:50 mixture of ethylene carbonate and propylene carbonate with 0,5 M KI and 0,05 M I$_2$ was then used to fill the nanocrystalline network, i.e., drawn into the pores of said network by capillary forces. The flexible Al/SnO$_2$/nanocrystalline TiO$_2$-dye multilayer stack was unrolled against the Al/ITO/Pt plate, allowing the electrolyte to be evenly applied over the entire area of the device.

Subsequently, the aluminium on the side of the second electrode was removed.

Example 2

Made as specified in Example 1. However, in this embodiment of the device after the joining of the cathode and anode carriers and sealing, the aluminium on the side of the first electrode was etched away, leaving the SnO$_2$ exposed. The SnO$_2$ was subsequently protected by a polymer encapsulent.

Example 3

Made as specified in Example 1 with the counter electrode (cathode) being made of the same Al/SnO$_2$ foil as used for the anodes. This Al/SnO$_2$ cathode was first treated with hexachloroplatinic acid as in example A. The Al/SnO$_2$/nanocrystalline TiO$_2$-dye anode and the Al/SnO$_2$/Pt cathode foils were then joined while filling the pores in the nanocrystalline TiO$_2$-dye layer and the small spacing between the two foils with liquid electrolyte as in Example 1.

After joining the cathode and anode carriers and sealing, the aluminium on either the cathode or the anode is etched away, leaving one SnO$_2$ layer exposed to the surface. This SnO$_2$ layer can be protected by a polymer encapsulant afterwards.

The current/voltage curve of each of the above-described devices showed that electrical power was generated upon exposure to light.

What is claimed is:

1. A method of making a photovoltaic cell at least comprising the following layers in the following order: a first electrode layer, a transparent wide band gap semiconductor layer provided with a layer of a photosensitising dye or pigment which in combination with the semiconductor layer has the ability to spatially separate photogenerated electrons from their positive countercharges, an electrolyte layer, a catalyst layer, and a second electrode layer, which method is characterised in that the first electrode layer and the semiconductor layer are sequentially deposited in that order on a flexible temporary substrate that is removed later on and/or the second electrode layer and the catalyst layer are deposited on a flexible temporary substrate that is removed later on, and the electrode or electrodes that are deposited over a temporary substrate are transparent.

2. A method according to claim 1 wherein said sequence of layers is laminated together before removal of the temporary substrate or substrates.

3. A method according to claim 2 wherein the sequence of layers is spotbonded together at the interface of the catalyst layer and the semiconductor layer.

4. A method according to any one of claims 1–2 wherein the first electrode layer is provided with a carrier layer or a transparent layer on the side facing away from the semiconductor layer.

5. A method according any one of claims 1–2 wherein the second electrode layer is provided with a carrier layer or a transparent layer on the side facing away from the catalyst layer, with the proviso that at least if the first electrode layer is provided with a carrier layer, the second electrode layer is provided with a transparent layer, and vice versa.

6. A method according to claim 5 wherein the carrier layer or transparent layer on the first electrode layer and the carrier layer or transparent layer on the second electrode layer extend beyond the inner layers of the cell on at least two opposing sides and are sealed together.

7. A method according to any one of claims 1–3 wherein the semiconductor layer comprises titanium dioxide.

8. A method according to any one of claims 1–3 wherein the semiconductor layer is applied on the first electrode layer while this electrode layer is warm.

9. A method according to any one of claims 1–3 wherein the semiconductor layer is deposited directly onto the first electrode layer by means of CVD or spray pyrolysis.

10. A method according to any one of claims 1–3 wherein at least the electrode layer on the front side of the photovoltaic cell is deposited at a temperature higher than 400° C.

11. A method according to any one of claims 1–3 wherein the deposition of the electrode layer on the flexible temporary substrate is carried out in a roll-to-roll process.

12. A method according to claim 11 wherein the PV cell is prepared using a roll-to-roll process.

* * * * *